(12) United States Patent
Chuang et al.

(10) Patent No.: US 9,159,403 B2
(45) Date of Patent: Oct. 13, 2015

(54) CONTROL CIRCUIT OF SRAM AND OPERATING METHOD THEREOF

(71) Applicant: National Chiao Tung University, Hsinchu (TW)

(72) Inventors: Ching-Te Chuang, New Taipei (TW); Nan-Chun Lien, Taipei (TW); Wei-Nan Liao, Taichung (TW); Li-Wei Chu, New Taipei (TW); Chi-Shin Chang, Taichung (TW); Ming-Hsien Tu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 120 days.

(21) Appl. No.: 13/738,111

(22) Filed: Jan. 10, 2013

(65) Prior Publication Data

US 2014/0063918 A1 Mar. 6, 2014

(30) Foreign Application Priority Data

Sep. 6, 2012 (TW) .............................. 101132567 A

(51) Int. Cl.
*G11C 11/412* (2006.01)
*G11C 8/08* (2006.01)
*G11C 11/418* (2006.01)

(52) U.S. Cl.
CPC .............. *G11C 11/412* (2013.01); *G11C 8/08* (2013.01); *G11C 11/418* (2013.01)

(58) Field of Classification Search
CPC .................................... G11C 8/10; G11C 8/06
USPC ........ 365/154, 189.011, 189.05, 189.11, 205, 365/210.1, 210.12, 230.06, 230.08
See application file for complete search history.

(56) References Cited

U.S. PATENT DOCUMENTS

| | | | | |
|---|---|---|---|---|
| 5,255,224 A * | 10/1993 | Galbi et al. | ............... | 365/189.09 |
| 5,841,698 A * | 11/1998 | Hirano et al. | ............. | 365/185.21 |
| 5,909,402 A * | 6/1999 | Joo | ........................... | 365/189.07 |
| 5,969,998 A * | 10/1999 | Oowaki et al. | ............ | 365/189.09 |
| 6,335,900 B1 * | 1/2002 | Kwon et al. | ............. | 365/230.06 |
| 6,381,182 B1 * | 4/2002 | McStay | .................... | 365/189.09 |
| 6,535,424 B2 * | 3/2003 | Le et al. | ..................... | 365/185.18 |
| 6,816,401 B2 * | 11/2004 | Kauffmann et al. | .......... | 365/154 |
| 6,967,892 B2 * | 11/2005 | Tanaka et al. | ............ | 365/230.06 |
| 7,193,908 B2 * | 3/2007 | Kawasaki et al. | ........ | 365/189.11 |
| 7,283,413 B2 * | 10/2007 | Choi et al. | ..................... | 365/205 |
| 7,760,558 B2 * | 7/2010 | Ch'ng et al. | ............. | 365/189.11 |

(Continued)

*Primary Examiner* — Huan Hoang
*Assistant Examiner* — Roberto Mancera
(74) *Attorney, Agent, or Firm* — Bacon & Thomas, PLLC

(57) ABSTRACT

A control circuit of SRAM and an operating method thereof are provided. The control circuit includes a memory array, a word-line driver, a boost circuit and a voltage level detecting circuit. The memory array includes a plurality of memory cells. Each memory cell includes a plurality of transistors. The word-line driver is to activate the word-line of the memory array for cell storage data access. The boost circuit is to provide the higher voltage source for the word-line driver and a first operating voltage for boosting the first operating voltage to a second operating voltage. The voltage level detecting circuit is detecting if the first operation voltage needs to be boosted with boost-operation and a detecting-trigger signal and controls the operating of the boost circuit based on the detecting-trigger signal, the first operating voltage and a predetermined voltage.

2 Claims, 3 Drawing Sheets

(56) References Cited

U.S. PATENT DOCUMENTS

| | | | |
|---|---|---|---|
| 7,876,634 B2 * | 1/2011 | New et al. | 365/205 |
| 8,248,079 B2 * | 8/2012 | Huang | 324/550 |
| 8,279,659 B2 * | 10/2012 | Cho et al. | 365/154 |
| 2001/0022753 A1 * | 9/2001 | Micheloni et al. | 365/203 |
| 2007/0133317 A1 * | 6/2007 | Yuan et al. | 365/189.09 |
| 2011/0199836 A1 * | 8/2011 | Kim et al. | 365/189.05 |
| 2013/0235679 A1 * | 9/2013 | Devulapalli | 365/189.011 |
| 2014/0204657 A1 * | 7/2014 | Dally | 365/154 |

* cited by examiner

CONTROL CIRCUIT OF SRAM AND OPERATING METHOD THEREOF

BACKGROUND OF THE INVENTION

1. Field of the Invention

This invention is related to a memory, and particularly to a control circuit of SRAM and an operating method thereof.

2. Description of the Prior Art

According to the operating type, conventional memory can be divided into several categories, such as the dynamic random access memory (DRAM) and static random access memory (SRAM). Wherein, the memory cell of static random access memory (SRAM) is composed of a plurality of transistors, which have a high switching speed and do not need any additional upgrading circuit. The so-called "static state" is when the power is applied to the static random access memory and the stored data can be kept constant. On the contrary, the data stored in dynamic random access memory (DRAM) has to be upgraded periodically. However, when the power supply is stopped completely, the data stored in static random access memory will disappear.

The static random access memory (SRAM) is generally applied to the products, such as portable electronic devices, the System-on-Chip (SOC), etc. At present, the design of common static random access memory (SRAM) comprises various types of structure, such as five-transistor structure, six-transistor structure or eight-transistor structure, etc.

However, under advanced semiconductor processes, the write ability of static random access memory is relatively low, it is necessary to use more transistors to complete the memory cells of a bit, so that the unit capacity will be lower, and the power consumption will be higher. Therefore, although word-line boost circuits are used, it's the risk is that the gate oxidization layer will be easy to penetrate.

Therefore, in order to produce more efficient static random access memory, provide better operating efficiency and lower manufacturing cost, it is necessary to research and develop new auxiliary circuits for static random access memory.

SUMMARY OF THE INVENTION

It is an objective of the present invention is to provide a control circuit for SRAM. In an embodiment, the control circuit of SRAM comprises a memory array, a word-line driver, a boost circuit and a voltage level detecting circuit. The memory array comprises a plurality of memory cells. Each memory cell includes a plurality of transistors. The word-line driver is to activate the word-line of the memory array for cell storage data access. The boost circuit is coupled with the word-line driver and the first operating voltage to provide the higher voltage source from the first operating voltage for boosting the first operating voltage to a second operating voltage. The voltage level detecting circuit is coupled with the first operating voltage and the DECT signal and commences to detect and to control the operating of the boost circuit based on the detecting-trigger signal, the first operating voltage and a predetermined voltage.

In an embodiment, if the first operating voltage is smaller than the predetermined voltage, the voltage level detecting circuit will activate the boost circuit. If the first operating voltage is greater than the predetermined voltage, the voltage level detecting circuit will control the boost circuit for stopping the boost treatment of the first operating voltage.

In an embodiment, the voltage level detecting circuit also includes a reference unit and a detecting unit. The reference unit has a first node. The detecting unit has a second node. The voltage of the first node equals to the voltage of the second node when detecting.

In an embodiment, the voltage level detecting circuit also includes a reference unit, which is coupled with the first operating voltage and the detecting unit.

In an embodiment, the voltage level detecting circuit also includes a first inverter and a first transistor reference unit. The first inverter is coupled with the DECT signal. The first transistor is coupled with the output terminal, the ground terminal of the first inverter and the detecting unit.

In an embodiment, the detecting unit also includes a second inverter and a third inverter. The detecting unit is coupled with the reference unit, the DECT signal and a fourth inverter.

In an embodiment, the operating method for the control circuit of SRAM includes controlling the operation of the boost circuit based on the DECT signal, the first operating voltage and a predetermined voltage; using the boost circuit to boost the first operating voltage to a second operating voltage; and using the second operating voltage to drive several transistors in the memory array.

In an embodiment, if the first operating voltage is smaller than the predetermined voltage, the boost circuit will be controlled for boosting the first operating voltage to a second operating voltage.

In an embodiment, if the first operating voltage is greater than the predetermined voltage, the boost circuit will be controlled for stopping the boost treatment of the first operating voltage.

In comparison with the prior art, the control circuit and its operating method of the present invention uses the voltage level detecting circuit to detect whether the operating voltage ($V_{DD}$) is greater than the predetermined voltage. If the operating voltage is greater than the predetermined voltage, the boost circuit will be shut down. If the operating voltage is smaller than the predetermined voltage, the boost circuit will be activated. In this kind of circuit design, the fault tolerance will be higher, and the gate oxidization layer of transistor in the memory cell will not be penetrated due to the boost circuit.

Therefore, the advantage and spirit of the present invention can be understood further by the following detailed description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
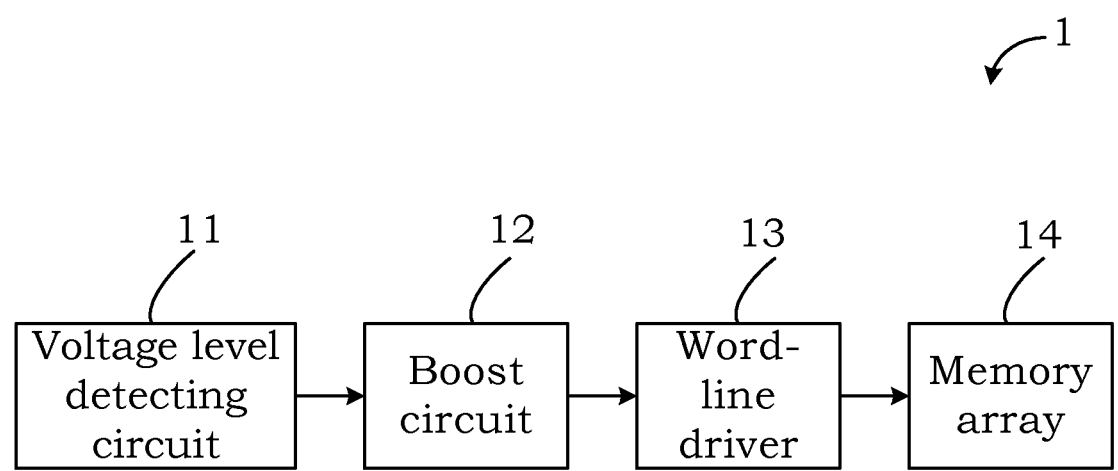
FIG. 1 shows a block diagram in accordance with an embodiment of the present invention.

FIG. 1 shows a block diagram in accordance with an embodiment of the present invention. The control circuit 1 for SRAM in accordance with an embodiment the present invention includes a voltage level detecting circuit 11, a boost circuit 12, a word-line driver 13 and a memory array 14.

The voltage level detecting circuit 11 of the present invention shown in FIG. 1 is coupled with the operating voltage $V_{DD}$ (not shown in the Figure), the ground terminal (not shown in the Figure) and the boost circuit 12. The boost circuit 12 is coupled with the operating voltage $V_{DD}$ (not shown in the Figure) and the word-line driver 13. The word-line driver 13 is coupled with the memory array 14. The word-line driver 13 is to activate the word-line of the memory array 14 for cell storage data access. In the present invention, the memory array 13 is of SRAM type memory, which may adopt 5 transistors, 6 transistors or 8 transistors, but are not limited by this. The boost circuit 12 is to provide a higher voltage source for the word-line driver 13 and a first operating voltage for boosting the first operating voltage to become a second operating voltage.

Figure 2:
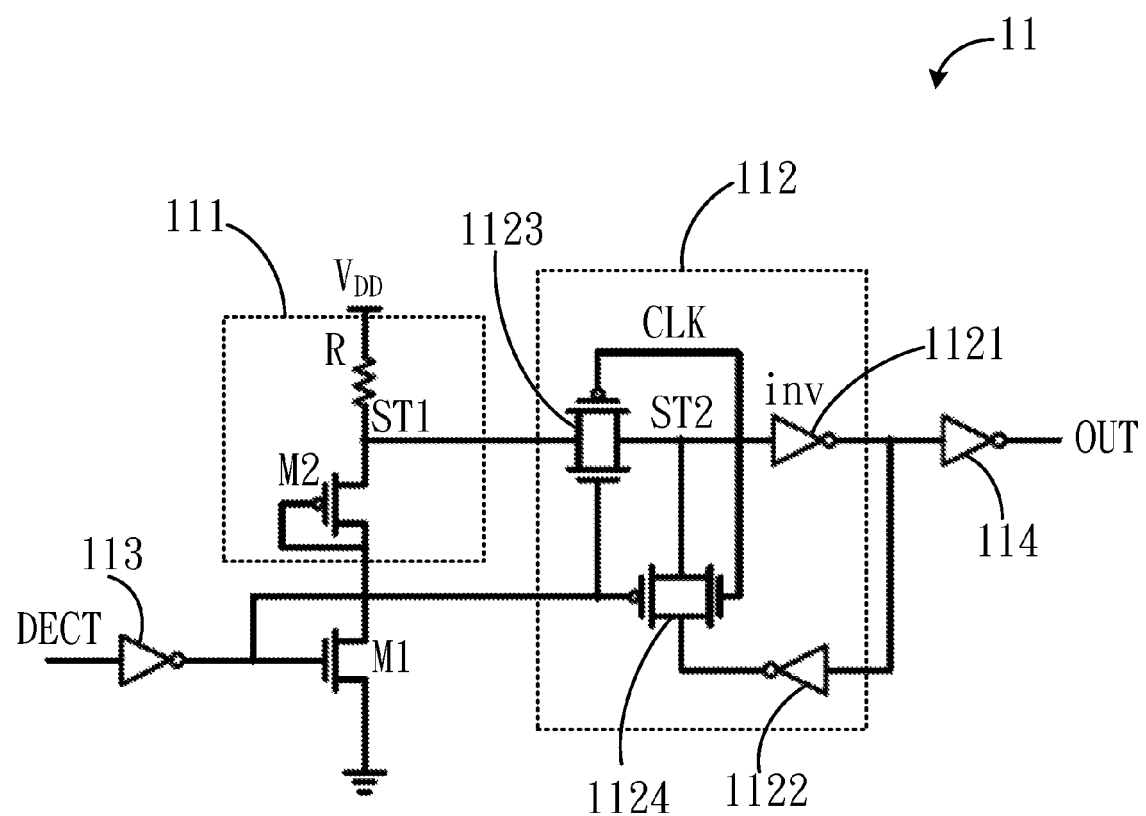
FIG. 2 shows the circuit of the voltage level detecting circuit in accordance with an embodiment of the present invention.

FIG. 2 shows the circuit of the voltage level detecting circuit in accordance with an embodiment of the present invention. The voltage level detecting circuit 11 is detecting if the first operating voltage $V_{DD}$ needs to be boosted with the boost-operation, a DECT signal; it controls the operation of the boost circuit based on the first operating voltage $V_{DD}$ and a predetermined voltage. The voltage level detecting circuit 11 shown in FIG. 2 comprises a reference unit 111, a detecting unit 112, a first inverter 113, a first transistor M1, and a second inverter 114. The reference unit 111 also comprises a resistor R and a second transistor M2. The detecting unit 112 also comprises a first transistor pair 1123, a second transistor pair 1124, a third inverter 1121 and a fourth inverter 1122.

In the embodiment of FIG. 2, the reference unit 111 provides a reference voltage based on the operating voltage $V_{DD}$ to the detecting unit 112. In this embodiment, the second transistor M2 is a P-type Metal-Oxide-Semiconductor Field-Effect Transistor (MOSFET), but not limited by this. One terminal of the resistor R of the reference unit 111 is coupled with the operating voltage $V_{DD}$. Another terminal of the resistor R of the reference unit 111 is coupled with the source of the second transistor M2. In addition, a first node ST1 is located between the resistor R and the second transistor M2. The gate of the second transistor M2 is connected with the drain of the second transistor M2.

In the embodiment of FIG. 2, the detecting unit 112 is coupled with the reference unit 111, the gate of the first transistor, the output terminal of the first inverter 113, and the input terminal of the second inverter 114. The first transistor M1 can be an N-type Metal-Oxide-Semiconductor Field-Effect Transistor, but not limited by this. The input terminal of the first inverter 113 is used to receive a detecting-trigger signal DECT. The output terminal of the first inverter 113 is coupled with the gate of the first transistor M1. The drain of the first transistor M1 is coupled with the drain of the second transistor M2. The source of the first transistor M1 is grounded.

In the embodiment of FIG. 2, the first transistor pair 1123 comprises a P-type Metal-Oxide-Semiconductor Field-Effect Transistor and an N-type Metal-Oxide-Semiconductor Field-Effect Transistor. The second transistor pair 1124 also comprises a P-type Metal-Oxide-Semiconductor Field-Effect Transistor and an N-type Metal-Oxide-Semiconductor Field-Effect Transistor. The gate of P-type MOS transistor of the first transistor pair 1123 and the gate of N-type transistor of the second transistor pair 1124 receive the detecting-trigger signal DECT. The gate of N-type MOS transistor of the first transistor pair 1123 and the gate of P-type transistor of the second transistor pair 1124 are coupled with the output terminal of the first inverter 113 to receive an inverted detecting-trigger signal. The first transistor pair is also coupled with the first node ST1.

In addition, a second node ST2 is located between the first transistor pair 1123 and the second transistor pair 1124 of the detecting unit 112 shown in FIG. 2. The voltage level of the first node ST1 and the second node ST2 is the same in this embodiment when it is in the detecting state with DECT low, and then after detecting a high DECT, the detecting unit latches the detecting signal, the output of the detecting unit being provided to the control unit through the second inverter 114.

However, in the other embodiment, the voltage level of the first node ST1 and the second node ST2 might be slightly different. In the detecting unit 112 of this embodiment, the input terminal of the third inverter 1121 is coupled with the second node ST2, the input terminal of the fourth inverter 1122 is coupled with the output terminal of the third inverter 1121, and the output terminal of the fourth inverter 1122 is coupled with the second transistor pair 1124. In addition, the input terminal of the second inverter 114 of the voltage level reference circuit 11 is coupled with the output terminal of the third inverter 1121 and the input terminal of the fourth inverter 1122. The output terminal of the second inverter 114 is coupled with the boost circuit 12 to control the operation of the boost circuit 12.

Figure 3:
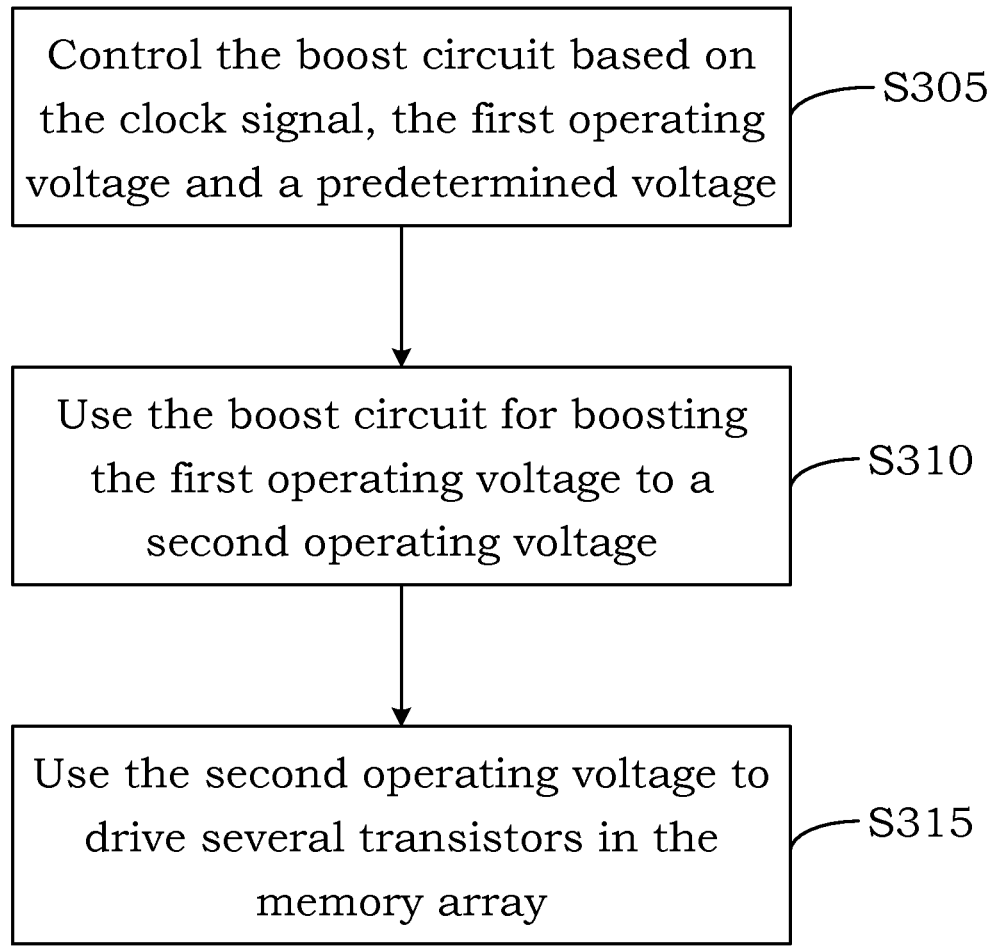
FIG. 3 shows the operating method for a control circuit of SRAM in accordance with the present invention.

FIG. 3 shows the operating method for the control circuit of SRAM in accordance with the present invention. Please refer to FIG. 1 and FIG. 2 for its description. In Step S305, the voltage level detecting circuit 1 controls the operation of the boost circuit 12 based on the detecting-trigger signal DECT, the operating voltage $V_{DD}$ and a predetermined voltage. In this embodiment, the predetermined voltage may be the trigger point of the third inverter 1121. The Step S305 will be further described as follows. When the first transistor pair 1123 is activated, the voltage of first node ST1 equals the voltage of second node ST2. Thus, the voltage level reference unit 111 controls the first transistor M1, the second transistor M2 and the detecting unit 112 based on the detecting-trigger signal DECT, and further compares the voltage of first node ST1 and the trigger point of the third inverter 1121, and then outputs a control signal to the boost circuit 12 through the second inverter 114.

In FIG. 3, if the operating voltage $V_{DD}$ is greater than the predetermined voltage through M2's current source due to voltage change ST1 of the resistor R, the voltage level detecting circuit 11 will control the boost circuit 12 for stopping the boost treatment of the operating voltage $V_{DD}$. If the operating voltage ST1 is smaller than the predetermined voltage, the voltage level detecting circuit will activate the boost circuit 12 by the control signal.

In Step S310 of FIG. 3, when the voltage level detecting circuit 11 activates the boost circuit 12 by the control signal, the boost circuit 12 will boost the operating voltage $V_{DD}$ to another operating voltage $V_{DD}'$ based on the abovementioned control signal. When the voltage level detecting circuit 11 stops the operation of the boost circuit 12, the boost circuit 12 will stop the boost treatment, so that the output voltage provided by the boost circuit 12 will not penetrate the gate oxidation layer, especially under high voltage operation.

In Step S315 of FIG. 3, the word-line driver 13 uses the operating voltage $V_{DD}'$ treated by the boost circuit 12 to drive several transistors in the memory array 14.

In comparison with the prior art, the embodiment of the present invention uses simple digital circuitry to judge whether the operating voltage $V_{DD}$ is greater than a predetermined voltage, in order to determine the operation of the boost circuit. The circuit of the present invention copes with the word-line driver to get higher fault tolerance and can avoid penetrating the gate oxidation layer, in order to raise the operating efficiency of SRAM and reduce the manufacturing cost of SRAM.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A control circuit of SRAM, comprising:
   a memory array having a plurality of memory cells, each said memory cell having a plurality of transistors:
   a word-line driver for activating a word-line of said memory array for cell storage data accessing;
   a boost circuit coupled to said word-line driver and a first operating voltage, wherein the boost circuit provides a higher voltage source than the first operating voltage by boosting the first operating voltage to a second operating voltage; and
   a voltage level detecting circuit coupled with said first operating voltage and a detecting-trigger signal line, a predetermined voltage and said first operating voltage controlling the operation of said boost circuit, wherein:
   the voltage level detecting circuit comprises a reference unit coupled with the first operating voltage and a detecting unit,
   the voltage level detecting circuit further comprises a first inverter and a first transistor,
   a first inverter is coupled with said detecting-trigger signal line,
   a first transistor is coupled with the output terminal of said first inverter, a ground terminal, and said detecting unit,
   said detecting unit comprises a second inverter and a third inverter, and
   said detecting unit is coupled with said reference unit, said detecting-trigger signal line, and a fourth inverter,
   wherein if said first operating voltage is greater than said predetermined voltage, said voltage level detecting circuit controls said boost circuit for stopping a boost treatment of said first operating voltage, and if said first operating voltage is smaller than said predetermined voltage, said voltage level detecting circuit activates said boost circuit,
   wherein said reference unit includes a resistor connected between a source of said first operating voltage and a second transistor, and a first node being located between said resistor and said second transistor, said second transistor being connected to said first inverter and said first transistor, and said detecting unit including a second node located between a first transistor pair and a second transistor pair,
   wherein a first node voltage of said first node equals a second node voltage of said second node when said detecting-trigger signal line is low, and
   wherein said detecting unit latches a detecting unit output of said detecting unit when said detecting-trigger signal line becomes high.

2. An operating method for the control circuit of SRAM having the memory array, the word-line driver, the boost circuit, and the voltage level detecting circuit according to claim 1, comprising:
   controlling the operation of a boost circuit based on a detecting-trigger signal, a first operating voltage and a predetermined voltage;
   using the boost circuit to boost the first operating voltage to become a second operating voltage; and
   using the second operating voltage to drive several transistors in the memory array,
   wherein based on said detecting-trigger signal line, said first operating voltage and said predetermined voltage, if said first operating voltage is smaller than said predetermined voltage, said boost circuit is controlled for boosting said first operating voltage to become said second operating voltage, and
   wherein based on said detecting-trigger signal line, said first operating voltage and said predetermined voltage, if said first operating voltage is greater than said predetermined voltage, said boost circuit is controlled for stopping a boost treatment of said first operating voltage.

* * * * *